US012578654B2

(12) United States Patent
Manger et al.

(10) Patent No.: US 12,578,654 B2
(45) Date of Patent: Mar. 17, 2026

(54) METHOD FOR CALIBRATING A MANIPULABLE OPTICAL MODULE

(71) Applicant: Carl Zeiss SMT GmbH, Oberkochen (DE)

(72) Inventors: Matthias Manger, Aalen (DE); Regina Christ, Aalen-Unterkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 121 days.

(21) Appl. No.: 18/731,762

(22) Filed: Jun. 3, 2024

(65) Prior Publication Data

US 2024/0319614 A1     Sep. 26, 2024

Related U.S. Application Data

(63) Continuation of application No. PCT/EP2022/084229, filed on Dec. 2, 2022.

(30) Foreign Application Priority Data

Dec. 10, 2021    (DE) ..................... 10 2021 214 142.0

(51) Int. Cl.
*G03F 7/00* (2006.01)

(52) U.S. Cl.
CPC ...... *G03F 7/70516* (2013.01); *G03F 7/70258* (2013.01); *G03F 7/70504* (2023.05); *G03F 7/70508* (2013.01)

(58) Field of Classification Search
CPC ............. G03F 7/70516; G03F 7/70258; G03F 7/70504; G03F 7/70508; G03F 7/70266; G02B 26/0825
See application file for complete search history.

(56) References Cited

U.S. PATENT DOCUMENTS 7,639,901 B2 * 12/2009 Lianza ................. H04N 9/3182
                                                                 385/115
9,715,181 B2 * 7/2017 Schmitt-Weaver ..........................
                                                                 G03F 7/70516
(Continued)

FOREIGN PATENT DOCUMENTS

DE    10 2010 044 969 A1    3/2012
DE    10 2011 081 603 A1    10/2012
(Continued)

OTHER PUBLICATIONS

Translation of International Search Report for corresponding PCT Appl No. PCT/EP2022/084229, dated Mar. 6, 2023.
(Continued)

*Primary Examiner* — Hung V Nguyen
(74) *Attorney, Agent, or Firm* — Fish & Richardson P.C.

(57) ABSTRACT

A method for calibrating a manipulable optical module for a microlithographic projection exposure apparatus, which comprises at least one manipulation element for setting an at least one-dimensional local variation profile of an optical property of the optical module is provided. The method comprises: applying a temporally varying excitation signal to the at least one manipulation element; determining a raw measurement data set via a measurement device measuring the respective local variation profile resulting at different times during the variation of the excitation signal; estimating a temporally varying scaling, caused by the temporal variation of the excitation signal, in the variation profiles of the raw measurement data set; determining a full effect profile of the optical property by fitting the temporally varying scaling to the variation profiles of the raw measurement data set; and determining calibration data of the manipulable optical module on the basis of the full effect profile.

20 Claims, 9 Drawing Sheets

(56)                    References Cited

U.S. PATENT DOCUMENTS

| | | | |
|---|---|---|---|
| 11,415,895 B2 * | 8/2022 | Nefzi | ................. G03F 7/70258 |
| 2009/0310145 A1 | 12/2009 | Sugiyama et al. | |
| 2013/0188162 A1 | 7/2013 | Gerhard et al. | |
| 2022/0382166 A1 | 12/2022 | Manger et al. | |

FOREIGN PATENT DOCUMENTS

| | | |
|---|---|---|
| DE | 10 2020 201 724 A1 | 8/2021 |
| JP | 2013-161992 A | 8/2013 |

OTHER PUBLICATIONS

German Office Action, with translation thereof, for corresponding DE Appl No. 102021214142.0, dated May 3, 2022.

Ricci, D. et al.: *"Calibration of force actuators on an adaptive secondary prototype"*, Applied Optics vol. 47, No. 20, pp. 3631-3636 (2008).

Ruppel, T. et al.: *"Model-Based Feedforward Control of Large Deformable Mirrors"*, European Journal of Control, vol. 17, Issue 3, pp. 261-272 (2011).

Frazier, B.W. et al.: *"Robust control of an adaptive optical system"*, Proc. Instn Mech. Engrs vol. 218 Part B: J. Engineering Manufacture, pp. 353-358 (2004).

Translation of International Preliminary Report on Patentability for corresponding PCT Appl No. PCT/EP2022/084229, dated Jun. 5, 2024.

* cited by examiner

Selecting at least one manipulation element of a manipulable optical module for a microlithographic projection exposure apparatus and applying a temporally varying excitation signal to the selected manipulation element.

~S1

Determining a raw measurement data set by way of a measurement device measuring the respective local variation profile resulting at different times during the variation of the excitation signal.

~S2

Ascertaining a corrected measurement data set by mathematically removing known measurement influences which are caused by the measurement device from the variation profiles of the raw measurement data set.

~S3

Performing a principal component analysis on the corrected measurement data set to ascertain eigenmodes and selecting one of the ascertained components, in particular the first component, as a reduced effect profile.

~S4

Calculating a respective profile excitation amplitude of the reduced effect profile in a plurality of the variation profiles of the corrected measurement data set and determining a temporally varying scaling.

~S5

Fitting the temporally varying scaling in each case to the variation profiles of the raw measurement data set for common locations of the variation profiles over the time course and determining a respective excitation amplitude of the temporally varying scaling at the respective location of the variation profiles.

~S6

Fig. 6

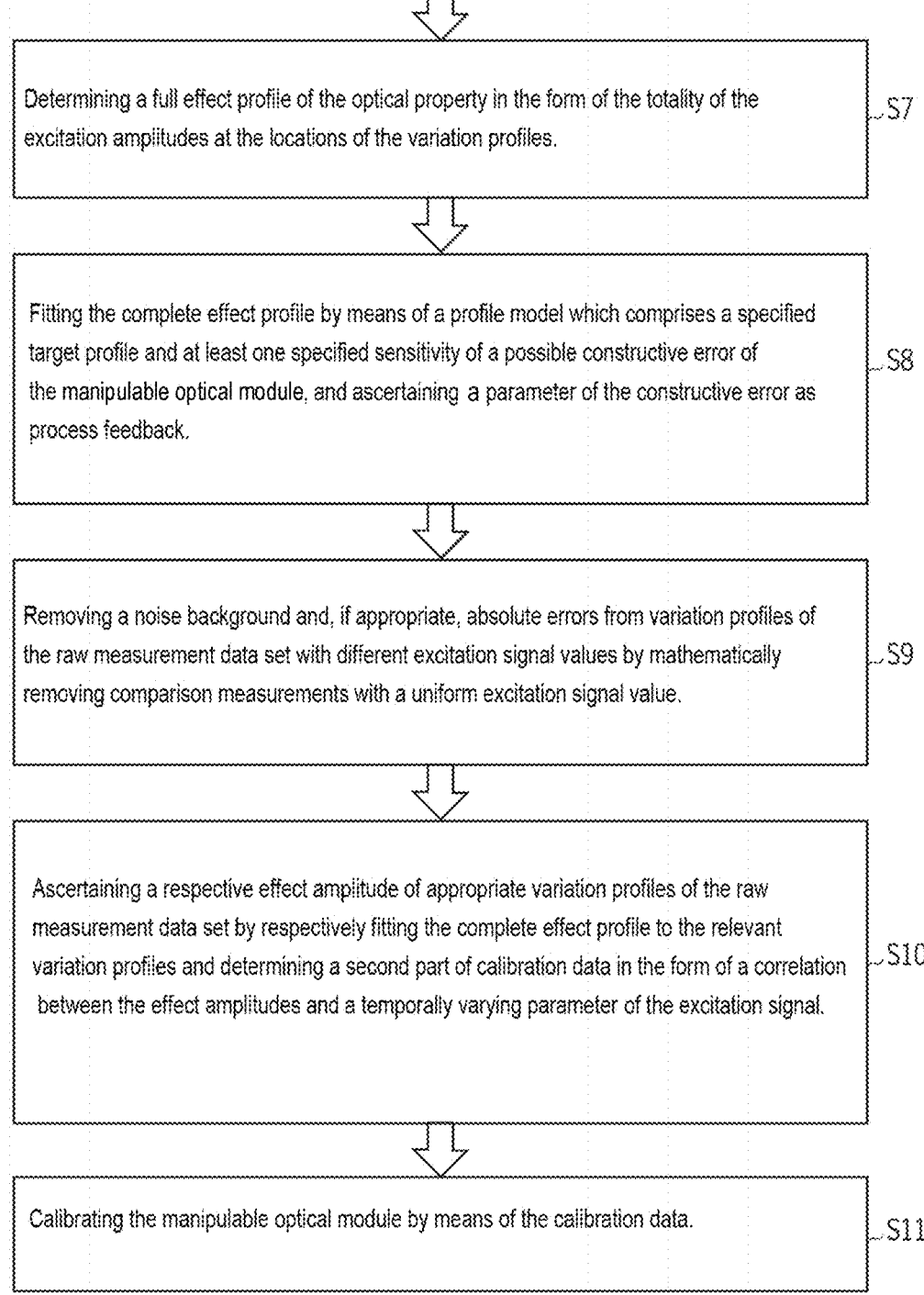

Determining a full effect profile of the optical property in the form of the totality of the excitation amplitudes at the locations of the variation profiles.          S7

Fitting the complete effect profile by means of a profile model which comprises a specified target profile and at least one specified sensitivity of a possible constructive error of the manipulable optical module, and ascertaining a parameter of the constructive error as process feedback.          S8

Removing a noise background and, if appropriate, absolute errors from variation profiles of the raw measurement data set with different excitation signal values by mathematically removing comparison measurements with a uniform excitation signal value.          S9

Ascertaining a respective effect amplitude of appropriate variation profiles of the raw measurement data set by respectively fitting the complete effect profile to the relevant variation profiles and determining a second part of calibration data in the form of a correlation between the effect amplitudes and a temporally varying parameter of the excitation signal.          S10

Calibrating the manipulable optical module by means of the calibration data.          S11

Fig. 7

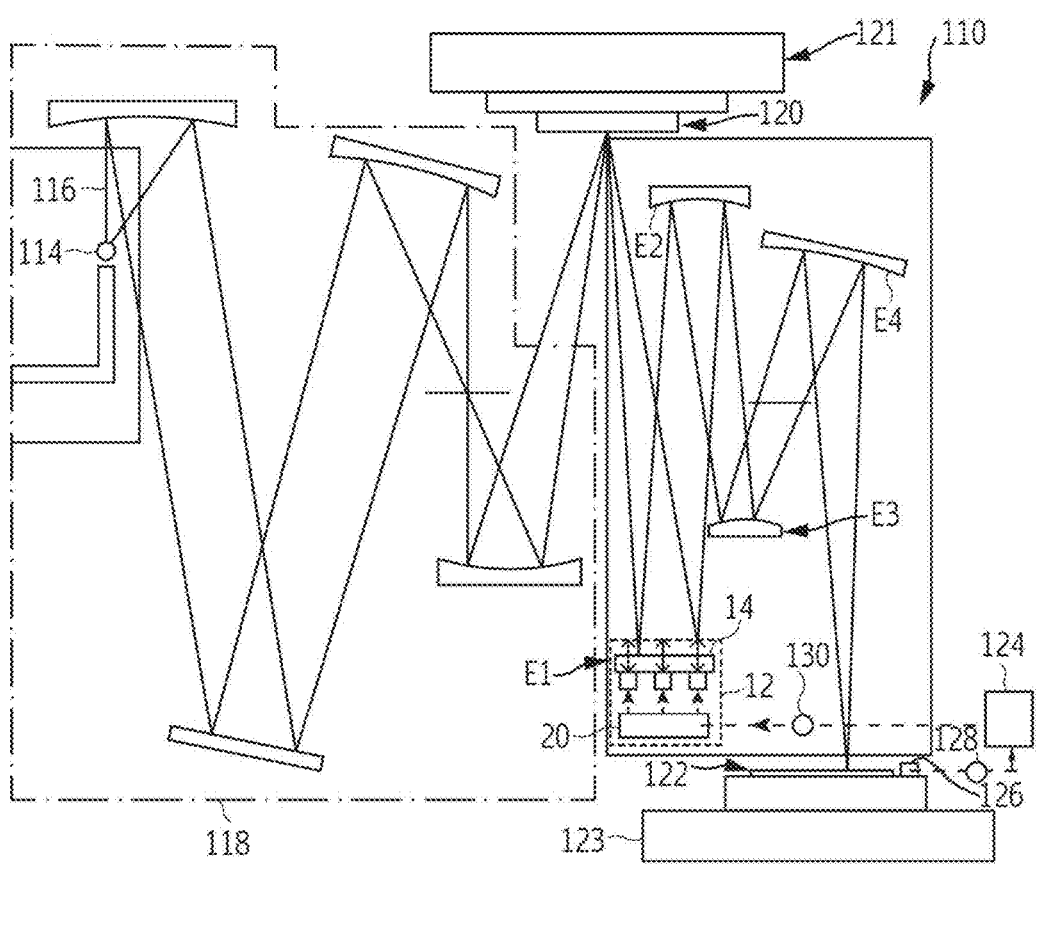
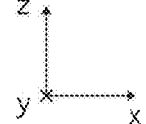
Fig. 12

METHOD FOR CALIBRATING A MANIPULABLE OPTICAL MODULE

CROSS-REFERENCE TO RELATED APPLICATIONS

The present application is a continuation of, and claims benefit under 35 USC 120 to, international application No. PCT/EP2022/084229, filed Dec. 2, 2022, which claims benefit under 35 USC 119 of German Application No. 10 2021 214 142.0, filed Dec. 10, 2021. The entire disclosure of each of these applications is incorporated by reference herein.

FIELD

The disclosure relates to a method and an apparatus for calibrating a manipulable optical module for a microlithographic projection exposure apparatus.

BACKGROUND

The manipulable optical module comprises a plurality of manipulation elements for setting an at least one-dimensional local variation profile of an optical property of the optical module. The variation profile can also be referred to as a manipulation profile and can be, for example, a deformation profile of an optical surface of the optical module or a variation of the refractive index of the optical module. The manipulation elements may comprise actuators, as described for example in JP 2013-161992 A. In order to help ensure the most accurate imaging of mask structures onto the wafer, a microlithographic projection exposure apparatus with a projection lens with relatively low wavefront aberrations is desirable. Projection lenses are often equipped with manipulators for changing the pose of optical elements or with the aforementioned manipulable optical module which allows, if appropriate in interaction with other manipulators, the correction of wavefront errors by, for example, a deformation of the optical element.

To this end, the aberration characteristic of the projection lens is usually measured regularly and, if appropriate, changes in the aberration characteristic between the individual measurements are determined by simulation. A manipulator controller ascertains from the aberration characteristic an actuation signal, which is transmitted to the manipulable optical module and, if appropriate, to other actuators. The actuation signal transmitted to the manipulable optical module specifies a variation profile or actuation profile which is set by the optical module, or specifies a correction of the already set variation profile. Unfortunately, there are often deviations between the actual variation profile set and the variation profile specified by the actuation signal.

SUMMARY

The disclosure seeks to provide a method and a microlithographic projection exposure apparatus with a manipulable optical module can be calibrated with relatively high accuracy and comparatively small time expenditure and with a variation profile of an optical property of the calibrated module specified via an actuation signal can be set on the optical module with high accuracy.

According a first aspect, the disclosure provides a method for calibrating a manipulable optical module for a microlithographic projection exposure apparatus. The manipulable optical module comprises at least one manipulation element for setting an at least one-dimensional local variation profile of an optical property of the optical module. The method according to the disclosure comprises the steps of: applying a temporally varying excitation signal to the at least one selected manipulation element, determining a raw measurement data set via a measurement device measuring the respective local variation profile resulting at different times during the variation of the excitation signal, estimating a temporally varying scaling, caused by the temporal variation of the excitation signal, in the variation profiles of the raw measurement data set, determining a full effect profile of the optical property by fitting the temporally varying scaling to the variation profiles of the raw measurement data set, and determining calibration data of the manipulable optical module on the basis of the full effect profile.

The local variation profile of an optical property, which can also be referred to as manipulation profile and, for example, is a deformation profile of an optical surface of the optical module, is for example a two-dimensional variation profile. For example, the excitation signal is a temporally varying voltage. Determining the raw measurement data set "via a measurement device measuring the respective local variation profile resulting at different times during the variation of the excitation signal" means that the determination of the raw measurement data set comprises at least the measurement of these variation profiles of the optical property.

In other words, the variation profiles of the raw measurement data set contain temporally varying scaling which is caused by the temporal variation of the excitation signal and is estimated in the abovementioned method. This means that the relevant variation profile is scaled in dependence on the respective value of the excitation signal. This means that there would be no temporally varying scaling in the case of a fictitious temporally constant excitation signal. The temporally varying scaling can be determined, for example, by computational simulation of the variation profiles in dependence on the temporal variation of the excitation signal. Alternatively, the temporally varying scaling can be determined by performing an eigendecomposition on the basis of the raw measurement data set, as described in more detail below.

"Fitting" a profile to measurement data is understood to mean providing the profile with certain variable parameters and then selecting the variable parameters via regression calculation in such a way that the profile is optimally adapted to the measurement data. For example, the mean square deviation of the profile or a different type of metric describing the deviation can be minimized.

Fitting the temporally varying scaling according to the disclosure to the variation profiles of the raw measurement data set for determining the full effect profile is understood to mean that the temporally varying scaling is provided with at least one variable parameter and that the at least one variable parameter is selected in the fitting method in such a way that the temporally varying scaling is optimally adapted to the variation profiles of the raw measurement data set.

The determination of the calibration data on the basis of the full effect profile can take place by determining the full effect profile directly as calibration data. Alternatively or in addition, further calculations can be performed on the basis of the full effect profile to determine a further part of the calibration data.

The calibration data generated via the method can be used for calibrating a control unit of the manipulable optical module, i.e. a characteristic curve of the control unit can be set on the basis of the calibration data in such a way that an actuation signal is converted into a specified variation profile of the optical property with high accuracy.

Due to the use according to the disclosure of a temporally varying excitation signal for determining the raw measurement data set and the estimation of the temporally varying scaling, caused by the temporal variation of the excitation signal, in the variation profiles, it is possible to suppress not only static errors, but for example also dynamic or random errors in the determination of the calibration data, without significantly extending the measurement time when measuring the variation profiles. Static errors are understood to mean, for example, systematic errors caused by alignment errors of the measurement device, and random errors are understood to mean, for example, errors caused by detector noise or streaks in the measurement device. In contrast to certain conventional measurement methods in which a reduction of the background noise by the factor N by averaging the measurement data results in a measurement time extension by $N^2$, noise suppression can be achieved with considerably less time expenditure in the method according to the disclosure due to the use of the excitation signal and the temporally varying scaling.

According to one embodiment, a projection exposure apparatus comprises a plurality of manipulation elements and the calibration method comprises the further step of selecting at least one of the manipulation elements, wherein the temporally varying excitation signal is applied to the selected manipulation element.

According to an embodiment, the temporally varying scaling is estimated via a computational simulation of the effect of the at least one manipulation element resulting at the different times during the variation of the excitation signal. The effect of the manipulation element is caused by the variation of the excitation signal. In other words, the temporally varying scaling is estimated by simulation calculation, for example on the basis of a priori knowledge of the manipulable optical module and the measurement device. The simulation calculation thus ascertains for example the manipulator response to the temporally varying excitation signal.

According to an embodiment, the estimation of the temporally varying scaling in the variation profiles of the raw measurement data set comprises the following steps: determining a reduced effect profile by performing an eigendecomposition on the basis of the raw measurement data set and selecting an eigenmode ascertained in the process as a reduced effect profile, and estimating the temporally varying scaling, caused by the temporal variation of the excitation signal, of the reduced effect profile in the variation profiles of the raw measurement data set. The full effect profile of the optical property, which is determined by fitting the temporally varying scaling to the variation profiles of the raw measurement data set, can also be referred to as a "complete effect profile" in contrast to the reduced effect profile.

In the measured variation profiles of the raw measurement data set, the reduced effect profile represents at least one component that may be superposed by other components. When estimating the temporally varying scaling, caused by the temporal variation of the excitation signal, of the reduced effect profile in the variation profiles, the component corresponding to the reduced effect profile is analyzed with regard to its temporally varying scaling. In this text, the temporally varying scaling is also referred to as the temporally varying effect signal.

According to one embodiment, a corrected measurement data set is determined by mathematically removing known measurement influences which are caused by the measurement device from the variation profiles of the raw measurement data set. Such measurement influences are usually temporally varying influences on the measurement result and may comprise, for example, mechanical alignment drifts of the measurement device. The presence of the measurement influences mentioned usually leads to a deteriorated measurement accuracy. Determining the corrected measurement data set "by mathematically removing known measurement influences which are caused by the measurement device from the variation profiles of the raw measurement data set" means that the determination of the corrected measurement data set comprises at least mathematically removing these known measurement influences. Mathematically removing these measurement influences can be achieved, for example, by fitting one or more degrees of freedom of the measurement device or of the measurement setup, such as tilt, defocus and coma, to the variation profiles of the raw measurement data set. According to one embodiment variant, the eigendecomposition, which is performed on the basis of the raw measurement data set, takes place on the corrected measurement data set.

According to an embodiment, estimating the temporally varying scaling, caused by the temporal variation of the excitation signal, of the reduced effect profile in the variation profiles of the raw measurement data set comprises the calculation of a respective profile excitation amplitude of the reduced effect profile in a plurality of the variation profiles of the corrected measurement data set and representing the calculated profile excitation amplitudes as the temporally varying scaling in dependence on the respective measurement times of the underlying variation profiles of the raw measurement data set. In other words, the representation of the calculated profile excitation amplitudes in dependence on the respective measurement time of the underlying variation profiles of the raw measurement data set results in the temporally varying scaling.

The calculation of the respective profile excitation amplitude of the reduced effect profile in a plurality of the variation profiles of the corrected measurement data set takes place for example by fitting the reduced effect profile to the relevant variation profile. The calculation of the respective profile excitation amplitude is effected according to one embodiment for all variation profiles of the corrected measurement data set. The respective measurement times at which the calculated profile excitation amplitudes are represented are understood to mean the measurement times of the associated variation profile from the raw measurement data set.

According to an embodiment, fitting the temporally varying scaling for determining the full effect profile comprises a respective fitting of the temporally varying scaling to the variation profiles of the raw measurement data set at a plurality of locations in the variation profiles of the raw measurement data set over the time course of the variation profiles. From this, a respective excitation amplitude of the temporally varying scaling is determined for the respective location in the variation profiles. The totality of the determined excitation amplitudes forms the full effect profile. In other words, the temporally varying scaling is fitted to the variation profiles of the raw measurement data set for different common locations of the variation profiles to determine a respective excitation amplitude of the temporally varying scaling in the variation profiles, wherein the totality of the excitation amplitudes determined for the different common locations forms the full effect profile of the optical property.

Fitting the temporally varying scaling to the variation profiles of the raw measurement data set is understood to mean that at least the amplitude of the scaling is set as a variable in the fitting method and then the excitation amplitude is selected via regression calculation in such a way that the temporally varying scaling is optimally adapted to the variation profiles of the raw measurement data set at the respective common location. The amplitudes ascertained at the different locations together form the full effect profile.

According to an embodiment, a respective effect amplitude of the relevant variation profile is further ascertained by respectively fitting the full effect profile to appropriate variation profiles of the raw measurement data set. A correlation between the effect amplitudes and a temporally varying parameter of the excitation signal is provided as calibration data, optionally in addition to the complete effect profile itself, by the calibration method. This means that the calibration data comprise the correlation between the effect amplitudes and the temporally varying parameter of the excitation signal. The temporally varying parameter may be a voltage of the excitation signal. The effect amplitude can denote a scaling factor by which the full effect profile is to be multiplied in order to obtain substantially the relevant variation profile. When fitting the full effect profile to the appropriate variation profiles, measurement influences which are caused by the measurement device are mathematically removed according to one embodiment.

According to one embodiment variant of the aforementioned embodiment, the excitation signal is configured such that comparison measurements with a uniform excitation signal value are carried out at different times during the measurement of the variation profiles of the raw data set. Before fitting the full effect profile to the appropriate variation profiles, a background noise is removed from the variation profiles via the comparison measurements. For example, the comparison measurements are what are known as zero measurements in which the excitation signal has the value zero or a fixed offset voltage. According to one embodiment variant, real zero points, i.e. voltage values of 0 V, can also be included in the alternating signal. These zero points can be provided at regular time intervals and serve as reset points, for example to include in the measurement of hysteresis effects of the manipulable optical module.

According to an embodiment, the full effect profile is fitted via a profile model, which comprises a specified target profile and at least one specified sensitivity of a possible constructive error of the manipulable optical module. The fitting process determines a parameter of one or more associated constructive errors. The parameters ascertained with respect to one or more constructive errors can serve as process feedback to avoid the same constructive errors in the production of further optical modules, i.e. the production processes can be adapted accordingly such that the constructive errors no longer occur or occur to a reduced extent in optical modules produced at a later time. According to an embodiment, the temporally varying excitation signal is formed by superposition of a basic signal with an alternating signal. For example, the basic signal can be ramp-shaped. The alternating signal forms a carrier wave, which periodically or aperiodically jumps between two different signal levels, wherein the signal levels can represent discrete values or value ranges, i.e. the upper and lower values of the alternating signal can either remain fixed over time or vary within an upper or lower value range. According to one embodiment, one of the signal levels has the value zero. The superposition of the basic signal with the alternating signal can be a multiplicative superposition. Furthermore, the signal resulting from the multiplicative superposition can be provided with an offset such that, when assigning a neutral value to one of the signal levels, a value which is defined by the basic signal and is repeatedly interrupted by the neutral value results for the excitation signal.

According to an embodiment, the eigendecomposition is carried out on the corrected measurement data set when ascertaining the reduced effect profile. For example, a principal component analysis is performed on the corrected measurement data set.

According to an embodiment, the variation profile is a deformation profile of an optical surface of the optical module. According to one embodiment variant, the at least one manipulation element is configured as an actuator. For example, a plurality of manipulation elements are configured as actuators. The actuator or actuators may be configured to change its extent parallel to the optical surface. Alternatively, the actuator or actuators may be configured to change its extent transversely to the optical surface. According to an alternative embodiment variant, the at least one manipulation element is a heating element, which is configured to change the shape of the optical surface by spot heating of an optical element.

According to an embodiment, the variation profile describes a variation in refractive index in an optically transmissive material. Such a variation in refractive index can be effected, for example, by setting a temperature profile via corresponding manipulation elements configured as heating or cooling elements. Alternatively, the variation profile may describe a variation of a polarization property in an optical element of the projection exposure apparatus.

According to an aspect, the disclosure provides an apparatus for calibrating a manipulable optical module for a microlithographic projection exposure apparatus, which comprises at least one manipulation element for setting an at least one-dimensional local variation profile of an optical property of the optical module. The apparatus according to the disclosure comprises a signal transmitter for applying a temporally varying excitation signal to the at least one manipulation element, a measurement device for determining a raw measurement data set by measuring the respective local variation profile resulting at different times during the variation of the excitation signal, and an evaluation device. The evaluation device is configured to estimate a temporally varying scaling, caused by the temporal variation of the excitation signal, in the variation profiles of the raw measurement data set, to determine a full effect profile of the optical property by fitting the temporally varying scaling to the variation profiles of the raw measurement data set, and to determine calibration data of the manipulable optical module on the basis of the full effect profile.

The temporally varying scaling can also be referred to as a temporally varying effect signal, via which the calculated profile excitation amplitudes are represented in dependence on the respective measurement times of the underlying variation profiles.

The features indicated with regard to the abovementioned embodiments, exemplary embodiments or embodiment variants, etc., of the method according to the disclosure can be correspondingly applied to the calibration apparatus according to the disclosure and vice versa. These and other features of the embodiments according to the disclosure will be explained in the description of the figures and in the claims. The individual features can be implemented, either separately or in combination, as embodiments of the disclosure. Furthermore, they can describe embodiments which are independently protectable and protection for which is claimed only during or after dependency of the application, as the case may be.

BRIEF DESCRIPTION OF THE DRAWINGS

The above and further features of the disclosure will be illustrated in the following detailed description of exemplary embodiments according to the disclosure with reference to the accompanying schematic drawings. In the drawings:

FIG. 6 shows a first section of a flowchart of a method for calibrating the manipulable optical module, which can be carried out via the calibration apparatus according to the disclosure;

FIG. 7 shows a second section of the flowchart of the method for calibrating the manipulable optical module, which can be carried out via the calibration apparatus according to the disclosure;

FIG. 12 shows an illustration of an embodiment according to the disclosure of a microlithographic projection exposure apparatus with an integrated manipulable optical module.

DETAILED DESCRIPTION

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the disclosure.

Figure 1:
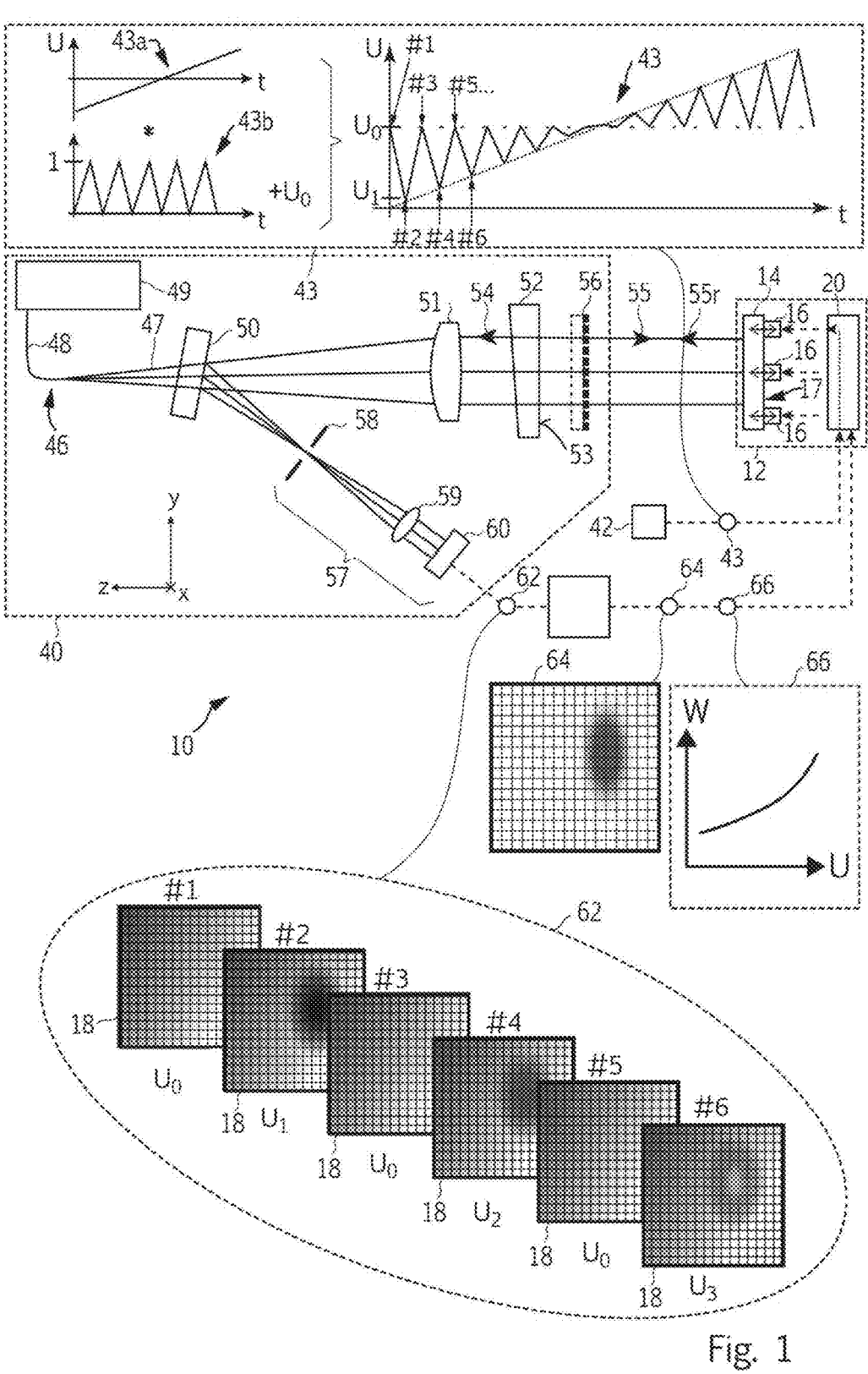
FIG. 1 shows an exemplary embodiment of a calibration apparatus according to the disclosure of a manipulable optical module for a microlithographic projection exposure apparatus with a measurement device for measuring a raw measurement data set generated via an excitation signal and an evaluation device for evaluating the raw measurement data set.

In order to facilitate the description, a Cartesian xyz-coordinate system is indicated in the drawing, from which system the respective positional relationship of the components illustrated in the figures is evident. In FIG. 1, the x-direction runs perpendicular to the drawing plane into the latter, the y-direction runs upward, and the z-direction runs to the left.

FIG. 1 illustrates an exemplary embodiment of a calibration apparatus 10 for calibrating a manipulable optical module 12. The manipulable optical module 12 is provided for installation in a microlithographic projection exposure apparatus, such as in the projection exposure apparatus 110 for EUV microlithography illustrated in FIG. 12. The manipulable optical module 12 comprises an optical element, here in the form of a deformable mirror element 14, a plurality of manipulation elements 16 for setting an at least one-dimensional local variation profile 18 of an optical property of the optical module 12, and a control unit 20 for controlling the manipulation elements 16. In the embodiment according to FIG. 12, the mirror element 14 of the manipulable optical module 12 serves as a mirror element E1 of a projection lens 112 of the projection exposure apparatus 110. In the present case, the variation profile 18 is a deformation profile of a reflective optical surface 15 of the mirror element 14 and thus the optical property is surface deviations of the optical surface 15. The variation profile 18 is represented in the present case by a two-dimensional matrix $M_{ij}$, which indicates for points $P_{ij}$ of a two-dimensional grid on the optical surface 15 respective deformation values, i.e. deviations of the optical surface 15 at the point $P_{ij}$ from the target shape of the optical surface 15 present in the unmanipulated state. The indices i and j number the points $P_{ij}$ in the x- and y-directions respectively.

In the embodiment as a mirror element E1 of the projection lens 112 according to FIG. 12, the reflective optical surface 15 of the mirror element 14 in the unmanipulated state may be a spherical or non-spherical surface for reflecting EUV radiation having a wavelength of less than 100 nm, such as a wavelength of about 13.5 nm or about 6.8 nm. The non-spherical surface of the mirror may for example be formed as a free-form surface with a deviation from each rotationally symmetrical asphere of more than 5 μm and a deviation from each sphere of at least 1 mm.

Figures 8, 9, 10, 11:
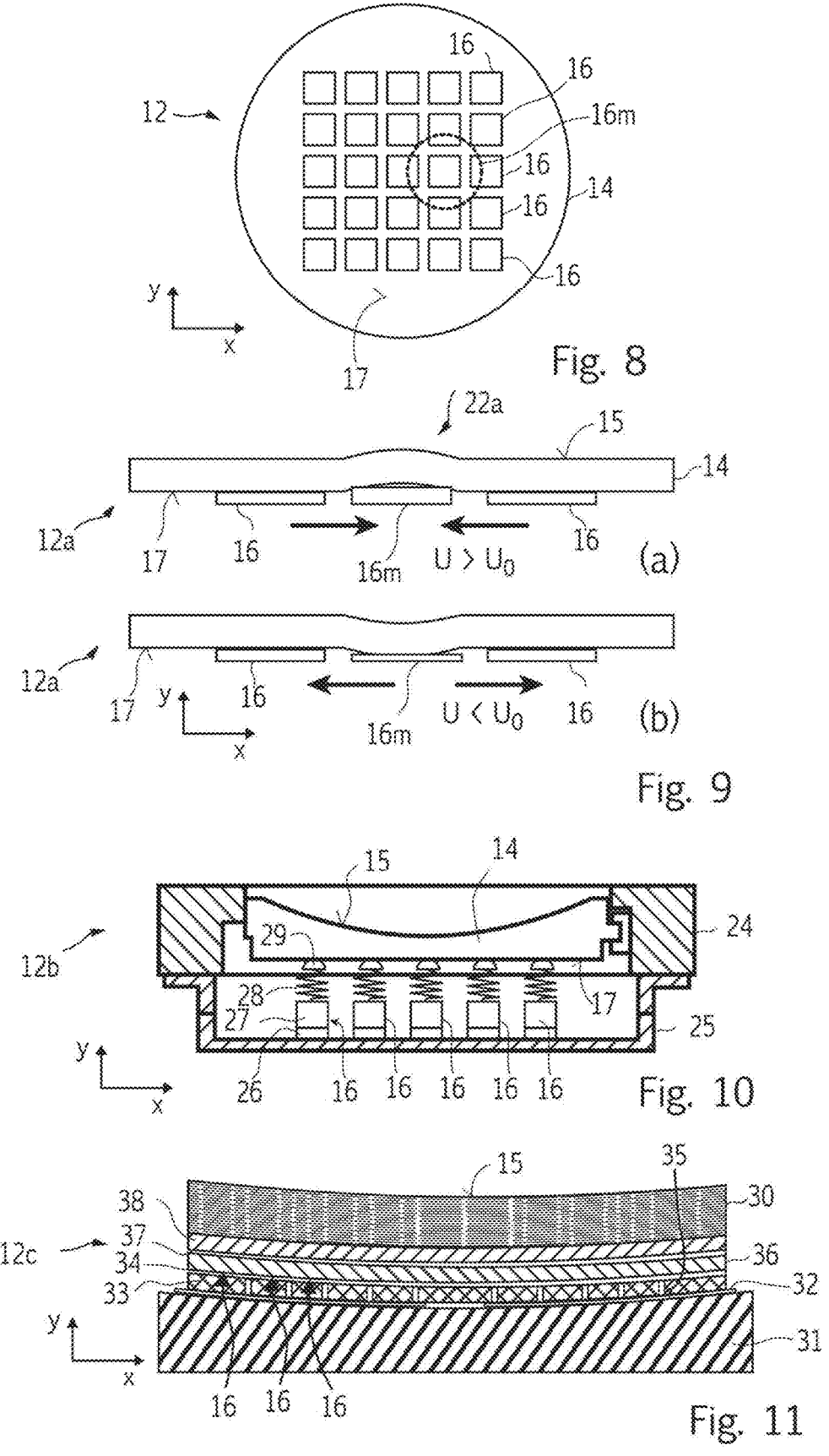
FIG. 8 shows a rear side of a mirror element of the manipulable optical module with manipulation elements arranged thereon.
FIG. 9 shows an embodiment of the manipulable optical module in a sectional view.
FIG. 10 shows a further embodiment of the manipulable optical module in a sectional view.
FIG. 11 shows a further embodiment of the manipulable optical module in a sectional view.

The manipulation elements 16 of the manipulable optical module 12 may be arranged along one dimension or in two dimensions along a rear side 17 of the mirror element 14 in a manner such that a one-dimensional or a two-dimensional variation profile 18 in the form of a deformation profile of the optical surface 15 is formed, as indicated in FIG. 1 with reference to double-headed arrows. FIG. 8 illustrates an embodiment of the manipulable optical module 12, in which a two-dimensional field with 5×5 manipulation elements 16 in the form of actuators are arranged on the rear side 17 of the deformable mirror element 14.

FIGS. 9 to 11 illustrate different embodiments of the manipulable optical modules 12, in which the manipulation elements 16 configured as actuators have different designs. In FIGS. 9 to 11, the abovementioned control unit 20 of the optical modules 12 is omitted for the purposes of simplifying the illustration.

In the embodiment 12a, shown in FIG. 9, of the manipulable optical module 12, the manipulation elements 16 mounted on the rear side 17 of the mirror element 14 are configured to change their extent parallel to the optical surface 15, i.e. perpendicular to the optical axis of the mirror element 14. For this purpose, the manipulation elements 16 can be designed as piezo elements, which are controlled by the control unit 20 with a voltage U. The totality of the manipulation elements 16 can be designed, for example, as a piezoelectric mat.

If a voltage $U > U_0$ is applied to the manipulation element 16, the manipulation element 16 shortens its transverse extent, i.e. its extent in the x-direction according to the coordinate system of FIG. 9, as is shown in FIG. 9*a* by way of a manipulation element designated as the middle manipulation element 16*m*. If the manipulation element 16*m* now becomes shorter while the adjacent manipulation elements 16 remain unmanipulated, the mirror material is compressed in the region of the manipulation element 16*m*, which thus forms an elevation 22*a* on the optical surface 15. If a voltage $U < U_0$ is applied to the manipulation element 16, the manipulation element 16 increases its transverse extent, as shown in FIG. 9*b* by way of the middle manipulation element 16*m*. If the manipulation element 16*m* then increases its transverse extent while the adjacent manipulation elements 16 remain unmanipulated, the mirror material is stretched in the region of the manipulation element 16*m*, i.e. the optical surface 15 is pulled toward the manipulation element 16*m*, which thus forms a recess 22*b* in the optical surface 15.

FIG. 10 illustrates a second exemplary embodiment 12*b* of the manipulable optical module 12, in which the mirror element 14 is configured as a deformable concave mirror. The manipulation elements 16 are designed as actuators, which act perpendicularly (i.e. in the z-direction) against the rear side 17 of the mirror element 14. Such a manipulable optical module 12*b* is described, for example, in JP 2013-161992 A. The mirror element 14 has a reflective coating on its front side for forming the reflective optical surface 15 and is fixed by a mirror holder 24.

The exemplary embodiment 12*b* of the optical module 12 further comprises a housing 25 and, fastened thereto, a multiplicity of manipulation elements 16 in the form of actuators. Each manipulation element 16 has a pressure sensor 26, a drive element 27, a spring 28, and a contact element 29. The drive element 27 is expandable in the y-direction and can be formed to be contractible and may for this purpose, for example, have a piezoelectric element or an ultrasonic motor. Depending on the extent of the drive element 27, a corresponding force acts in the contact region on the rear side 17 of the mirror element 14 via the spring 28 and the contact element 29. This causes a local deformation of the reflective optical surface 15. The acting force is detected by the pressure sensor 26 and can be processed by the control unit (not shown) for setting a specified deformation.

FIG. 11 illustrates a schematic cross section of a third exemplary embodiment 12*c* of a manipulable optical module 12 with a concave deformable mirror element 14. The manipulable optical module 12*c* contains under a reflective coating 30 forming the reflective optical surface 15 a piezoelectric layer 36, with which a local deformation of the reflective optical surface 15 can be effected by applying a voltage locally. Such a manipulable optical module 12*c* is described, for example, in DE 10 2011 081 603 A1.

The optical manipulator 12*c* comprises in the present case a concave substrate 31, on which a multiplicity of electrical lines 32 are arranged. Alternatively, the substrate 31 can also be convex. In a top view, each electrical line 32 contains a first contact surface in the immediate vicinity of the circumference of the substrate 31. Furthermore, each electrical line 32 contains a second contact surface, which is arranged in a via in an insulation layer 33 provided over the electrical lines 32. The insulation layer 33 supports a layer of control electrodes 34 with a two-dimensional embodiment, which are respectively electrically connected to the corresponding electrical line 32 by way of a through hole 35. The piezoelectric layer 36, which in turn supports a counter electrode 37, is arranged on the control electrodes 34. The counter electrode 37 extends over the entire piezoelectric layer 36 and supports a protection layer 38.

Finally, the reflecting coating 30 is arranged on the protection layer 38. By applying an appropriate voltage between a first contact surface and the counter electrode 37, a local deformation of the piezoelectric layer 36 in the region of the associated control electrode 34 is obtained. The local regions of the reflective coating 30 in the region of each of the control electrodes 34 thus individually represent in their optical effect settable zones of the manipulable optical module 12*c*. The respective control electrode 34 together with the adjoining section of the piezoelectric layer 36 and the associated section of the counter electrode 37 forms a respective manipulation element 16.

The calibration apparatus 10 illustrated in FIG. 1 comprises a measurement device 40, a signal transmitter 42, and an evaluation device 44. The signal transmitter 42 is used to apply a temporally varying excitation signal 43 to one or more manipulation elements 16 via the control unit 20 of the manipulable optical module 12. In this case, the signal transmitter 42 can generate the excitation signal 43 directly, and the control unit 20 can forward the excitation signal 43 to the relevant manipulation element(s) 16, as shown in FIG. 1. Alternatively, the signal transmitter 42 can also generate an appropriate control signal, via which the control unit 20 applies the corresponding excitation signal 43 to the relevant manipulation element(s) 16.

The measurement device 40 is configured for the interferometric shape measurement of the reflective optical surface 15 of the mirror element 14, serving as a test object, of the manipulable optical module 12. A deviation of the actual shape of the surface 15 from a target shape can be determined for example with the measurement device 40. The measurement device 40 comprises a radiation source 46 for providing sufficiently coherent measurement radiation 47, for example light, as the input wave. In this exemplary embodiment, the radiation source 46 comprises a waveguide with an exit surface, at which the input wave has its origin. The waveguide 48 is connected to a radiation-generating module 49, for example in the form of a laser. By way of example, a helium-neon laser with a wavelength of about 633 nm can be provided to this end. However, the measurement radiation 47 can also have a different wavelength in the visible or non-visible wavelength range of electromagnetic radiation. The radiation source 46 with the waveguide 48 is only an example of a radiation source 46 which can be used for the measurement device 40. In alternative embodiments, rather than the waveguide 48, an optical arrangement with lens elements, mirror elements or the like can be provided for providing a suitable input wave from the measurement radiation 47.

The measurement radiation 47 passes first through a beam splitter 50, then through a collimator 51, and is then incident on a Fizeau element 52 with a Fizeau surface 53, at which a reference wave 54 is generated in reflection. The measurement device 40 according to FIG. 1 is thus configured as a Fizeau interferometer. The measurement radiation 47 passing through the Fizeau element 52 serves as a test wave 55, wherein optionally a diffractive optical element 56 can be arranged in its beam path for adapting its wavefront to a target shape of the surface 15 of the mirror element 14 in the undeformed state. The diffractive optical element 56 may be omitted if the target shape of the surface 15 differs only slightly from a planar shape or a spherical shape. In the case of a greater deviation, for example when configuring the target shape as a free-form surface, the diffractive optical element 56 is used in addition to or alternatively to the collimator 51.

The test wave 55 is reflected at the optical surface 15, passes as a returning test wave 55*r*, optionally the diffractive optical element 56 and the Fizeau element 52, and then travels in the same beam path as the reference wave 54 to the beam splitter 50. The latter steers the combination of the returning test wave 55*r* and the reference wave 54 from the beam path of the incoming measurement radiation 47 into an observation unit 57, which serves for capturing an interferogram generated by superposition of the test wave 55*r* with the reference wave 54. The convergent beams of the test wave 55*r* and reference wave 54 pass through a stop 58 and an eyepiece 59 of the observation unit 57 and are finally incident on a two-dimensionally resolving detector module 60 of the observation unit 57.

The detector module 60 may comprise, for example, a CCD sensor and detects the interferogram generated by interfering waves.

Furthermore, the detector module 60 comprises an evaluation unit (not shown separately in the drawing) for determining the actual shape of the optical surface 15 from the detected interferogram or a plurality of detected interferograms. For this purpose, the evaluation unit has an appropriate data processing unit and uses corresponding calculation methods known to a person skilled in the art. The specific actual shape of the optical surface 15 represents the abovementioned local variation profile 18 in the form of a deformation profile.

The method for calibrating the manipulable optical module 12 carried out by the calibration apparatus 10 is described below with reference to the flowchart, which is shown in FIGS. 6 and 7 and comprises steps S1 to S11.

In a first step S1, a manipulation element 16 of the manipulable optical module 12 is first selected and the temporally varying excitation signal 43 is applied to the selected manipulation element 16. Alternatively, a plurality of manipulation elements 16 forming a cluster can also be selected, to which orthogonal temporally varying excitation signals 43 are then applied simultaneously. These cause orthogonal temporally varying scaling.

As illustrated in FIG. 1, the temporally varying excitation signal 43 represents a temporal voltage variation, i.e. the excitation signal 43 has a voltage U as a temporally varying parameter. The voltage variation is formed by a multiplicative superposition of a continuously rising or falling basic signal 43*a* with an alternating signal 43*b* and an additive superposition with an offset voltage $U_0$. The basic signal 43*a* is formed in the embodiment shown by a linearly rising voltage ramp. The alternating signal 43*b* forms a carrier wave, which periodically or aperiodically jumps between two signal levels, wherein the signal levels can represent discrete values or value ranges, i.e. the upper and the lower value of the alternating signal can either remain fixed over time or vary within an upper or lower value range.

In the illustrated exemplary embodiment of the alternating signal 43*b*, the two signal levels are formed by the values 1 and 0 which remain fixed over time and between which the alternating signal 43*b* jumps back and forth in a zigzag manner. Alternatively, a sinusoidal form of the alternating signal 43*b* is conceivable. The resulting excitation signal 43 is characterized by the regular back-and-forth jumping between the offset voltage $U_0$ and an incrementally increasing voltage value. According to one embodiment variant, real zero points, i.e. voltage values of 0 V, can also be included in the alternating signal 43. These zero points can be provided at regular time intervals and serve as reset points, for example to include in the measurement hysteresis effects of the manipulable optical module 12.

In a step S2, the measurement device 40 determines at regular intervals, specifically at each of the temporally successive extremes in the form of the spikes of the excitation signal 43, the respective resulting local variation profile 18 of the optical surface 15 of the manipulable optical module 12. The individual measurement points at which in each case a two-dimensional variation profile 18 is determined are numbered in the diagram of the excitation signal 43 (#1, #2, #3, . . . ). The variation profiles 18 determined in this case form a raw measurement data set 62, of which the variation profiles 18 for the first six measurements (#1 to #6) are shown in the lower section of FIG. 1. As can also be seen from the diagram of the excitation signal 43, the variation profiles 18 of the measurements #1, #3 and #5 were respectively generated with the excitation voltage $U_0$ and the measurements #2, #4 and #6 with the steadily increasing excitation voltage $U_1$, $U_2$ and $U_3$ respectively.

From the raw measurement data set 62, the evaluation device 44 ascertains in steps S3 to S10, described below, a full effect profile 64 of the optical property of the optical module 12 and a correlation 66 between the effect amplitudes W and the voltage of the excitation signal 43 and transmits these as calibration data to the control unit 20 of the manipulable optical module 12. The calibration data are used to calibrate the manipulable optical module 12 as part of step S11.

Figure 2:
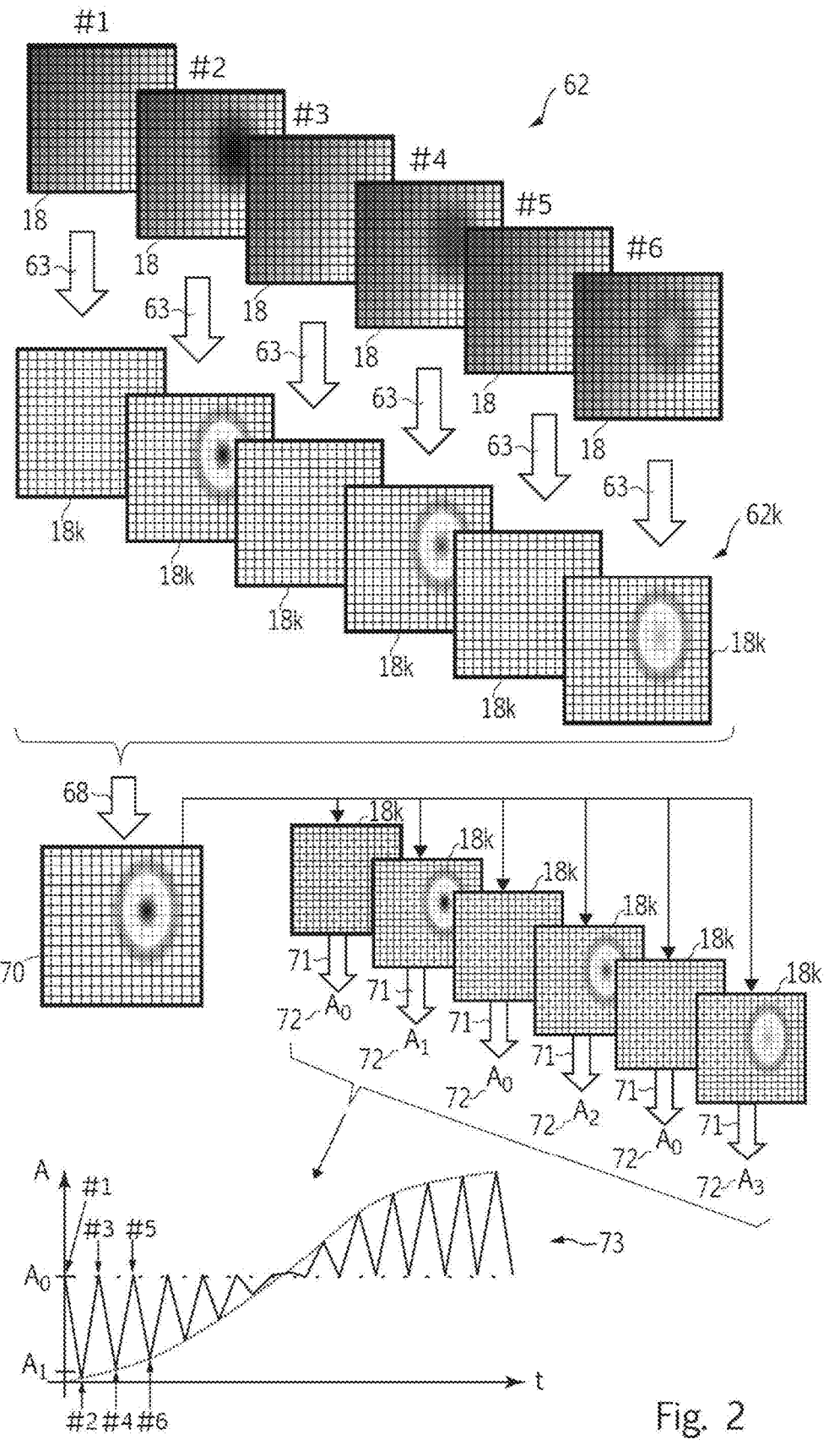
FIG. 2 shows a determination, taking place in the evaluation device, of a temporally varying scaling from the raw measurement data set.

In step S3, a corrected measurement data set 62*k* is generated from the raw measurement data set 62, as illustrated in the upper section of FIG. 2. For this purpose, measurement influences which are caused by the measurement device 40 are mathematically removed from each of the variation profiles 18 of the raw measurement data set 62. The corrected variation profiles 18*k* obtained in the process form the corrected measurement data set 62*k*. Mathematically removing the aforementioned measurement influences can be effected, for example, by fitting 63 one or more degrees of freedom of the measurement device 40, such as tilt, defocus and coma, to the variation profiles 18 of the raw measurement data set 62. Step S3 is optional. In the event that step S3 is omitted, the operations described in the following steps are carried out on the corrected measurement data set 62*k* in the same way as on the raw measurement data set 62 or, if appropriate, omitted.

In step S4, as illustrated in the lower section of FIG. 2, a principal component analysis 68 on the basis of an eigendecomposition is performed on the corrected measurement data set 62*k* for ascertaining a reduced effect profile 70. One of the components determined in the process, for example the first component, is selected as the reduced effect profile 70. In an eigendecomposition, a data set is decomposed into a set of eigenfunctions, also referred to as eigenmodes or eigenvibrations, and scaling or weighting factors assigned thereto, which are referred to as eigenvalues.

The principle of the eigendecomposition is also known to a person skilled in the art by the term "eigenvalue problem." The principle of the principal component analysis, which is also often referred to as "main axis transformation," is known to a person skilled in the art from multivariant statistics. In the principal component analysis 68 carried out in the present case, the variance is determined along the time sequence of the corrected variation profiles 18*k* modulated via the excitation signal 43. The extracted eigenvariances and the associated principal component vectors describe, sorted in descending order, the excited eigenvibrations of the modulated system. Assuming that the modulation with the excitation signal 43 serving as the carrier wave represents the greatest vibration in the system, the first principal component can be considered to be a reduced representation of the modulated variation of the optical property. The first principal component has the dimension of the variation profiles, so in the illustrated case is a two-dimensional value distribution, and serves as the abovementioned reduced effect profile 70. In other words, step S4 is used to ascertain eigenmodes via a principal component analysis on the corrected measurement data set and to select one of the ascertained eigenmodes as a reduced effect profile.

Step S5 involves calculating a respective profile excitation amplitude 72 of the reduced effect profile 70 in a plurality of the variation profiles 18$k$, for example in all variation profiles 18$k$, of the corrected measurement data set 62$k$. In other words, the profile excitation amplitudes 72 represent scaling factors which are assigned to the respective variation profiles 18$k$ and with which the correspondingly scaled reduced effect profile 70 is optimally adapted to the relevant corrected variation profile 18$k$. The calculation of the respective profile excitation amplitude 72 is carried out for example by fitting 71 the reduced effect profile to the relevant corrected variation profile 18$k$. As shown in FIG. 2, for the profile excitation amplitudes 72, a constant value $A_0$ alternates with a continuously increasing further value ($A_1$, $A_2$, $A_3$ etc.). Furthermore, a temporally varying scaling 73 is determined in step S5 from the calculated profile excitation amplitudes 72 by way of the calculated profile excitation amplitudes 72 being represented as a function of the respective measurement times of the underlying variation profiles 18$k$. The respective measurement times are understood to mean the measurement times of the variation profiles 18 on which the profile excitation amplitudes 72 are based. This temporally varying scaling 73 represents a temporally varying scaling, caused by the temporal variation of the excitation signal 43, of the reduced effect profile in the variation profiles 18$k$.

According to one embodiment variant, steps S4 and S5 can be replaced by estimating the temporally varying scaling 73 by computational simulation of the local variation profiles 18 resulting at the different times during the variation of the excitation signal. In other words, according to this embodiment variant, the temporally varying scaling 73 is estimated by simulation calculation on the basis of a priori knowledge of the manipulable optical module 12 and the measurement device 40.

Figure 3:
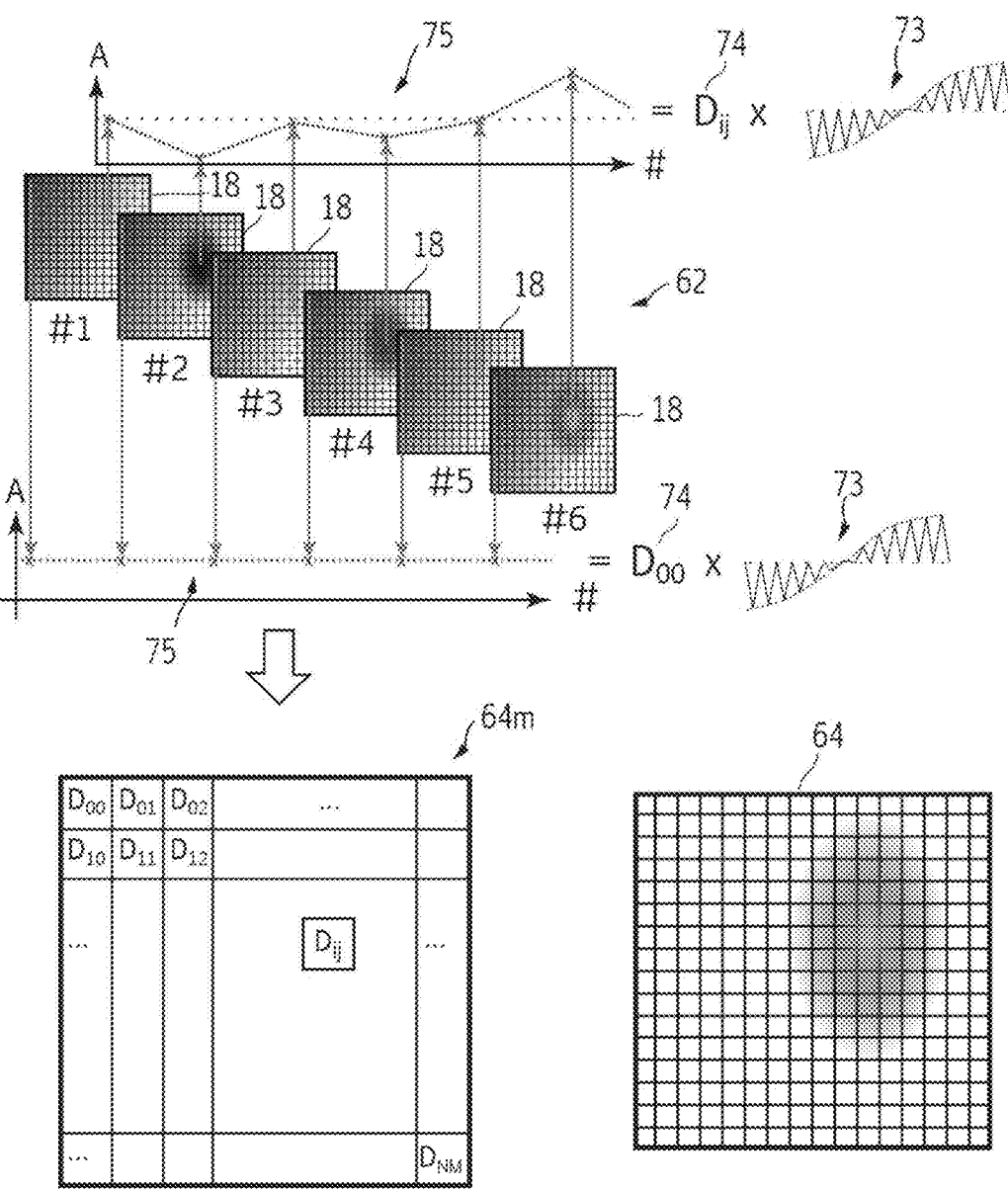
FIG. 3 shows a determination, furthermore taking place in the evaluation device, of a full effect profile from the raw measurement data set with the aid of the temporally varying scaling.

The following steps S6 and S7 are used to determine a full effect profile 64 by fitting the temporally varying scaling. In step S6, as illustrated in FIG. 3, the temporally varying scaling 73 is fitted in each case to the variation profiles 18 of the raw measurement data set 62 for common locations $P_{ij}$ of the variation profiles 18 over the time course and thus a respective excitation amplitude $D_{ij}$, provided with the reference sign 74, of the temporally varying scaling 73 is determined at the respective location of the variation profiles 18. The fitting takes place in each case to the amplitude variation 75 resulting for the respective location $P_{ij}$ from the different variation profiles 18. When fitting the scaling 73 to the variation profiles 18, at least the excitation amplitude $D_{ij}$ of the scaling 73 is set as variable at the respective point $P_{ij}$, i.e. the product from the scaling 73 and the variable excitation amplitude $D_{ij}$ is used for the fitting method. In the latter, for example, the value for the excitation amplitude $D_{ij}$ is selected via regression calculation in such a way that the scaling 73 is optimally adapted to the variation profiles 18 at the respective common location $P_{ij}$, specifically to an amplitude variation 75 of the variation profiles 18 at the respective location $P_{ij}$. This results in a value of the excitation amplitude $D_{ij}$ for each point $P_{ij}$.

The adaptation of the scaling 73 is illustrated in FIG. 3 for example for a point $P_{ij}$ in the region of a varying deformation of the optical surface 15 and a point Poo at the periphery of the optical surface 15, on which no varying deformation is present. The amplitude variation 75 resulting at the point $P_{ij}$ in the region of the varying deformation from the variation profiles 18 is characterized in that a constant amplitude value resulting from measurements #1, #3, #5, etc. alternates with a varying amplitude value resulting from measurements #2, #4, #6, etc. In the fitting method, the value for $D_{ij}$ is selected in such a way that the amplitude variation 75 is optimally adapted to the temporally varying scaling 73. At point Poo, a constant amplitude value results for the amplitude variation 75 for all measurements, with the result that the assigned value for Doo is substantially zero.

In step S7, the full effect profile 64 is determined from the excitation amplitudes $D_{ij}$ determined in step S6 by representing the totality of the excitation amplitudes $D_{ij}$ as a two-dimensional matrix 64$m$. The full effect profile 64 can already represent a first part of the calibration data transmitted to the control unit 20 of the manipulable optical module 12.

Figure 4:
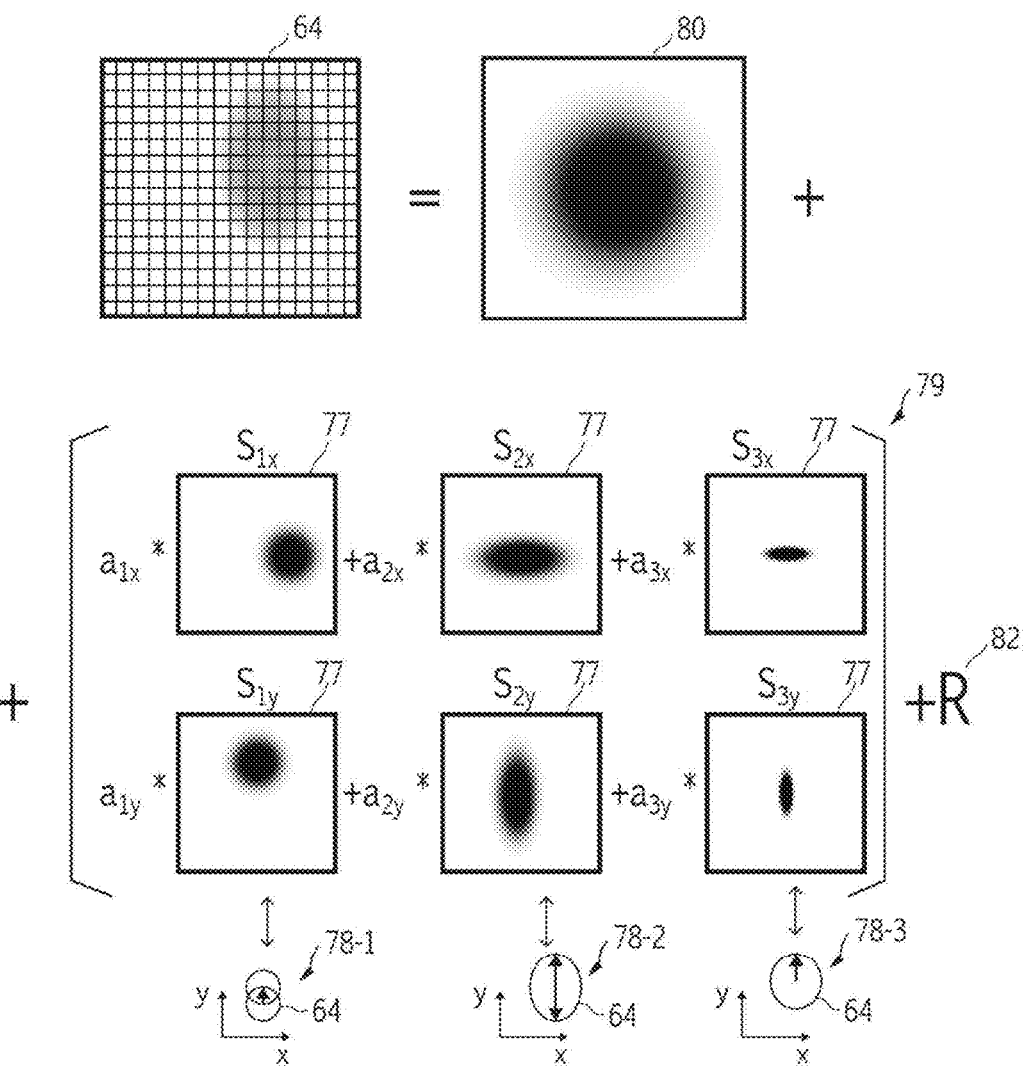
FIG. 4 shows an ascertainment, furthermore taking place in the evaluation device, of constructive errors of the manipulable optical module from the full effect profile.

In an optional step S8, as shown in FIG. 4, the full effect profile 64 is fitted via a profile model 76 and examined with regard to a plurality of possible constructive errors of the manipulable optical module 12. The profile model 76 comprises a specified target profile 80 and a respective specified sensitivity 77 of the possible constructive errors 78 of the manipulable optical module 12. In the example illustration according to FIG. 4, a two-dimensional Gaussian profile serves as target profile 80. By fitting the full effect profile 64 via the profile model 76, a change in the full effect profile 64 resulting from the constructive errors 78 is ascertained and the resulting parameters of the constructive errors are stored as process control parameters. The process control parameters can serve as process feedback to avoid the same constructive errors in the production of further manipulable optical modules. This allows the production processes to be adapted accordingly, such that the constructive errors no longer occur or occur to a reduced extent in optical modules produced at a later time.

A sensitivity indicates a relationship between a parameter value describing a magnitude of a constructive error 78 and a resulting change in the full effect profile 64. This resulting change is also referred to as the constructive error component of the full effect profile 64. In FIG. 4, the constructive error component, which corresponds to the change in the full effect profile 64 resulting from all modulated errors 78, is provided with the reference sign 79. FIG. 4 illustrates various possible specified sensitivities 77 by way of example, each of which indicates the corresponding correlation between a relevant constructive error 78 and the resulting change in the full effect profile 64.

For example, the sensitivities 77 denoted by Six and Sly relate to a constructive error 78-1 which causes a constant displacement of the effect profile 64 in the x- and y-directions respectively. This constructive error 78-1 may for example be due to a mispositioning of the manipulation element 16 activated during the measurement on the rear side 17 of the deformable mirror element 14. Referring to FIG. 8, this error occurs, for example, when the manipulation element 16$m$ is adhesively bonded to the rear side 17 of the mirror element 14 not exactly centrally between the adjacent manipulation elements 16, but at a position displaced in the x- or y-direction.

The sensitivities 77 denoted by $S_{2x}$ and $S_{2y}$ indicate a constructive error 78-2, which causes an enlargement in the effect profile 64 in the x- and in the y-direction respectively and thus a deformation of the cross section of the Gaussian effect profile 64 from a circular shape into an elliptical shape. This constructive error 78-2 can be attributed, for example, to inhomogeneities of the adhesive used for applying the manipulation elements 16 to the rear side 17 of the mirror element 14 according to FIG. 8, to inhomogeneities in the material of the mirror element 14 or the manipulation element 16, or to various clamping states.

The sensitivities 77 denoted by $S_{3x}$ and $S_{3y}$ denote a constructive error 78-3 which causes an asymmetrical enlargement of the effect profile 64 in the x- and y-directions respectively and thus a deformation of the cross section of the Gaussian effect profile 64 from a circular shape into an egg shape. This constructive error 78-3 can be caused for example by the occurrence of an air bubble below the manipulation element 16 activated during the measurement on the rear side 17 of the deformable mirror element 14.

The sensitivities $S_{1x}$, $S_{1y}$, $S_{2x}$, $S_{2y}$, $S_{3x}$ and $S_{3y}$ as well as any other sensitivities can be combined in what is known as a sensitivity matrix. However, depending on the constructive error possibilities, fewer sensitivities can be combined in the sensitivity matrix. In profile model 76, the sensitivities $S_{1x}$, Sly, $S_{2x}$, $S_{2y}$, $S_{3x}$ and $S_{3y}$ are used as linear combinations with the coefficients $a_{1x}$, $a_{1y}$, $a_{2x}$, $a_{2y}$, $a_{3x}$ and $a_{3y}$ respectively as variables. This linear combination is then the constructive error component 79 of the full effect profile 64. The profile model 76 now describes the full effect profile 64 as the sum of the specified target profile 80, the constructive error component 79, and a residual error 82.

The result of the fitting method comprises the values for the coefficients $a_{1x}$, $a_{1y}$, $a_{2x}$, $a_{2y}$, $a_{3x}$ and $a_{3y}$ and thus the constructive error component 79 as a whole, which represents the abovementioned change in the full effect profile 64 resulting from the constructive error 78.

Figure 5:
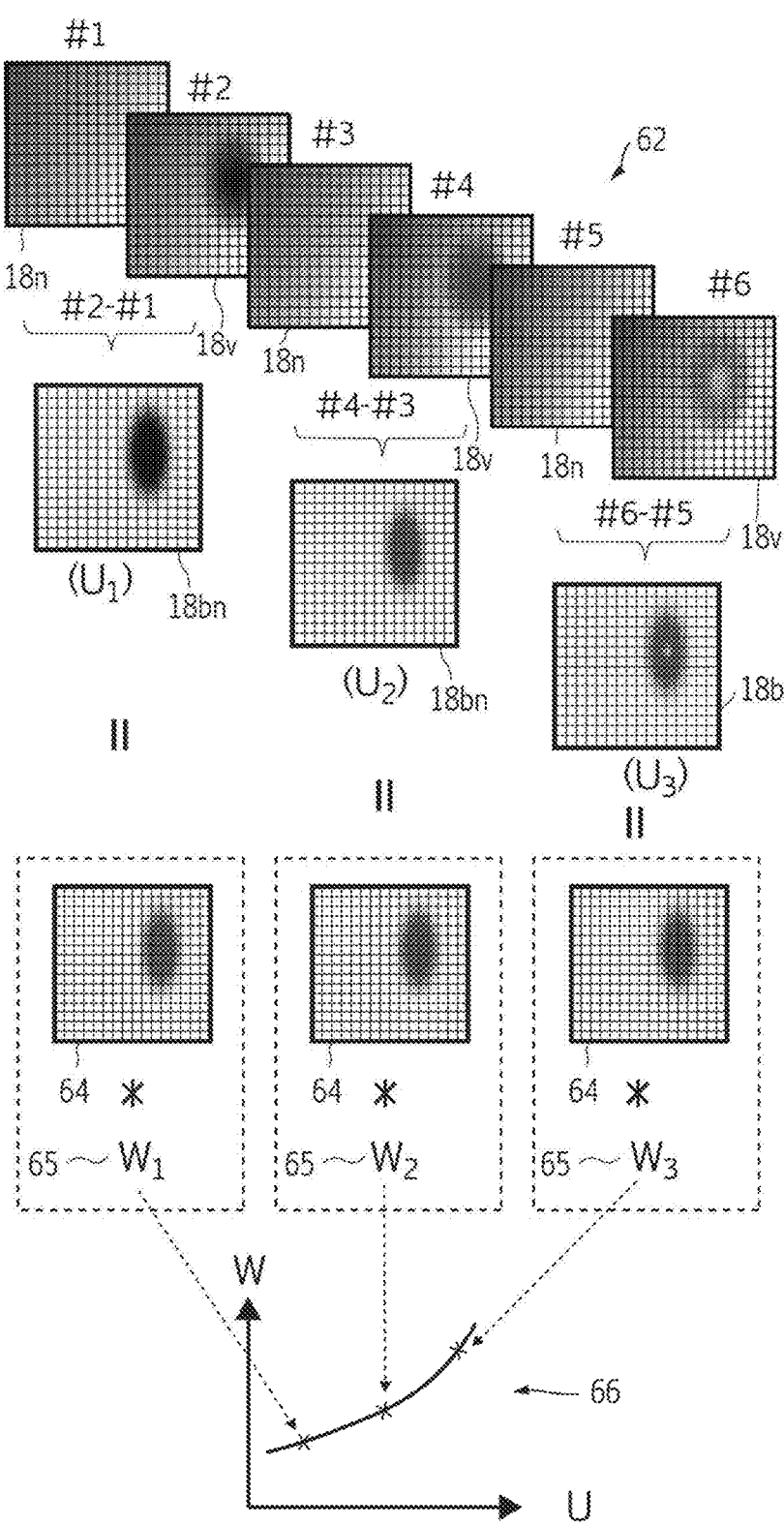
FIG. 5 shows a determination, furthermore taking place in the evaluation device, of a correlation between an effect amplitude of variation profiles of the raw measurement data set and a voltage of the excitation signal.

As illustrated in FIG. 5, a background noise is removed in step S9 from those variation profiles 18 of the raw measurement data set 62 which were generated with different excitation voltage values. These variation profiles 18, which are also referred to as used profiles 18n, are those variation profiles 18 which were generated with the excitation voltages $U_1$, $U_2$, $U_3$, etc., i.e., the variation profiles from measurements #2, #4, #6, etc. In contrast, the variation profiles 18 from measurements #1, #3, #5, etc., which are also referred to as comparison profiles 18v, were generated with the constant offset voltage $U_0$.

To remove the background noise and, if appropriate, absolute errors, the comparison profile 18v preceding or following a used profile 18n is subtracted from the relevant used profile 18n. Alternatively, the comparison profiles 18v preceding and following the relevant used profile 18n can be averaged beforehand. In other words, comparison measurements with a uniform excitation signal value, namely the offset voltage $U_0$, are mathematically removed from the variation profiles 18n. This results in so-called adjusted used profiles 18bn. In the example according to FIG. 5, for example, the comparison profile 18v of measurement #1 is subtracted from the used profile 18n of measurement #2 in order to obtain the adjusted used profile 18bn, which is denoted by ($U_1$). Similarly, the adjusted used profiles 18bn denoted by ($U_2$) and ($U_3$) are obtained from the difference of measurements #4 and #3 and measurements #6 and #5.

As further illustrated in FIG. 5, in step S10, the full effect profile 64 is fitted to each of the adjusted variation profiles 18bn, and a respective effect amplitude 65 is ascertained as the fitting result. The effect amplitude 65 denotes a scaling factor by which the full effect profile 64 is multiplied to obtain substantially the relevant variation profile 18bn. When fitting the full effect profile 64 to the adjusted variation profiles, alignment sensitivities of the measurement device 40 are taken into account in accordance with one embodiment. In other words, similar to step S3, measurement influences that are caused by the measurement device 40 are mathematically removed.

In the illustrated embodiment, the values $W_1$, $W_2$ and $W_3$ are shown by way of example as effect amplitudes 65 which are assigned to the voltage values $U_1$, $U_2$ and $U_3$. For example, when fitting the variation profile 18bn assigned to the voltage value $U_1$, the effect amplitude $W_1$ is ascertained in such a way that the product of the full effect profile 64 and the effect amplitude $W_1$ substantially corresponds to the mentioned variation profile 18bn.

The ascertained effect amplitudes $W_1$, $W_2$, $W_3$, etc. are plotted against the associated voltage values $U_1$, $U_2$, $U_3$, etc. By interpolation or fitting these discrete coordinate points, a correlation 66 between the effect amplitudes 65 and the voltage U representing the temporally varying parameter of the excitation signal 43 is ascertained. The discrete coordinate points can be fitted using an actuation model.

In step S11, the full effect profile 64 and the correlation 66 are transmitted as calibration data to the control unit 20, illustrated in FIG. 1, of the manipulable optical module 12 and the latter is calibrated using the calibration data. This is understood to mean that the voltage signals generated by the control unit 20 for setting a desired variation profile of the optical property of the optical module 12, such as the deformation profile of the reflective optical surface 15, are adapted on the basis of the transmitted calibration data in such a way that the desired variation profile is set with improved accuracy.

FIG. 12 shows an embodiment according to the disclosure of a microlithographic projection exposure apparatus 110 in which the manipulable optical module 12 can be used. The present embodiment is designed for operation in the EUV wavelength range, i.e., with electromagnetic radiation having a wavelength of less than 100 nm, such as a wavelength of approximately 13.5 nm or approximately 6.7 nm. All optical elements are embodied as mirrors as a result of this operating wavelength. However, the disclosure is not restricted to projection exposure apparatuses in the EUV wavelength range. Further embodiments according to the disclosure are designed, for example, for operating wavelengths in the UV range, such as, for example, 365 nm, 248 nm or 193 nm. In this case, at least some of the optical elements are configured as conventional transmission lens elements.

The projection exposure apparatus 110 according to FIG. 12 comprises an exposure radiation source 114 for generating exposure radiation 116. In the present case, the exposure radiation source 114 is embodied as an EUV source and can comprise, for example, a plasma radiation source. The exposure radiation 114 first passes through an illumination system 118 and is directed by the latter onto a mask 120. The illumination system 118 is configured to generate different angular distributions of the exposure radiation 116 incident on the mask 120. The illumination system 118 configures the angular distribution of the exposure radiation 116 incident on the mask 120 in dependence on an illumination setting desired by the user. Examples for selectable illumination settings comprise a so-called dipole illumination, annular illumination and quadrupole illumination.

The mask 120 has mask structures to be imaged on a substrate 122 in the form of a wafer and is displaceably mounted on a mask displacement stage 121. As depicted in FIG. 1, the mask 120 can be embodied as a reflection mask or, alternatively, it can also be configured as a transmission mask, for example for UV lithography. In the embodiment according to FIG. 12, the exposure radiation 116 is reflected at the mask 120 and thereupon passes through a projection lens 112 configured to image the mask structures onto the substrate 122. The exposure radiation 116 is guided within the projection lens 112 via a multiplicity of optical elements, presently in the form of mirrors. The substrate 122 is displaceably mounted on a substrate displacement stage 126. The projection exposure apparatus 110 can be embodied as a so-called scanner or a so-called stepper.

The projection lens 112 only has four optical elements E1 to E4 in the embodiment in accordance with FIG. 12. All optical elements can be moveably supported. For this purpose, each of the optical elements E1 to E4 can be assigned a respective manipulator, (not shown in the drawing). These manipulators are used to perform a respective rigid body movement of the assigned optical element E1 to E4.

The optical element E1 in the illustrated embodiment is part of the above-described manipulable optical module 12 calibrated via the calibration apparatus 10.

The projection exposure apparatus 10 further comprises a manipulator controller 124 for controlling the manipulable optical module 12, the abovementioned manipulators for performing rigid body movements, and, if appropriate, further manipulators. A state characterization 128 of the projection lens 112 is transmitted from a wavefront measurement device 126 to the manipulator controller 124. The wavefront measurement device 126 can be integrated into the substrate displacement stage 123. Based on the state characterization 128, the manipulator control 124 transmits an actuation signal 130 to the control unit 20 of the manipulable optical module 12 and optionally further actuation signals to further manipulators in order to correct an imaging error of the projection lens 112 that is apparent from the state characterization 128.

The above description of exemplary embodiments, embodiments or embodiment variants should be understood to be by way of example. The disclosure effected thereby firstly can enable the person skilled in the art to understand the present disclosure and the features associated therewith, and secondly encompasses alterations and modifications of the described structures and methods that are also obvious in the understanding of the person skilled in the art. Therefore, all such alterations and modifications, insofar as they fall within the scope of the disclosure in accordance with the definition in the accompanying claims, and equivalents are intended to be covered by the protection of the claims.

LIST OF REFERENCE SIGNS

10 Calibration apparatus
12 Manipulable optical module
12a First embodiment of the manipulable optical module
12b Second embodiment of the manipulable optical module
12c Third embodiment of the manipulable optical module
14 Deformable mirror element
15 Reflective optical surface
16 Manipulation element
16m Middle manipulation element 17 Rear side of the mirror element
18 Variation profile
18k Corrected variation profile
18n Used profile
18bn Adjusted used profile
18v Comparison profile
20 Control unit
22a Elevation
22b Depression
24 Mirror holder
25 Housing
26 Pressure sensor
27 Drive element
28 Spring
29 Contact element
30 Reflective coating
31 Substrate
32 Electrical lines
33 Insulation layer
34 Control electrodes
35 Via
36 Piezoelectric layer
37 Counter electrode
38 Protective layer
40 Measurement device
42 Signal transmitter
43 Excitation signal
43a Basic signal
43b Alternating signal
44 Evaluation device
46 Radiation source
47 Measurement radiation
48 Waveguide
49 Beam-generating module
50 Beam splitter
51 Collimator
52 Fizeau element
53 Fizeau surface
54 Reference wave
55 Test wave
55r Returning test wave
56 Diffractive optical element
57 Observation unit
58 Stop
59 Eyepiece
60 Detector module
62 Raw measurement data set
62k Corrected measurement data set
63 Fitting degrees of freedom of the measurement device to the variation profiles
64 Full effect profile
64m Two-dimensional matrix
65 Effect amplitude
66 Correlation
68 Principal component analysis
70 Reduced effect profile
71 Fitting
72 Profile excitation amplitude
73 Temporally varying scaling
74 Excitation amplitude
75 Amplitude variation
76 Profile model
77 Sensitivity
78 Constructive error
79 Constructive error component of the full effect profile
80 Target profile
82 Residual error

19

110 Microlithographic projection exposure apparatus
112 Projection lens
114 Exposure radiation source
116 Exposure radiation
118 Illumination system
120 Mask
121 Mask displacement stage
122 Substrate
123 Substrate displacement stage
124 Manipulator controller
126 Wavefront measurement device
128 State characterization
130 Actuation signal

What is claimed is:

1. A method for calibrating a manipulable optical module for a microlithographic projection exposure apparatus, the optical module comprising a manipulation element configured to set an at least one-dimensional local variation profile of an optical property of the optical module, the method comprising:

applying a temporally varying excitation signal to the manipulation element;

determining a raw measurement data using a measurement device measuring local variation profiles resulting at different times during the variation of the excitation signal;

estimating a temporally varying scaling, caused by the temporal variation of the excitation signal, in the variation profiles of the raw measurement data set;

determining a full effect profile of the optical property by fitting the temporally varying scaling to the variation profiles of the raw measurement data set; and determining calibration data of the manipulable optical module based on the full effect profile.

2. The method of claim 1, wherein the temporally varying scaling is estimated using a computational simulation of the effect of the manipulation element resulting at the different times during the variation of the excitation signal.

3. The method of claim 1, wherein estimating the temporally varying scaling in the variation profiles of the raw measurement data set comprises:

ascertaining a reduced effect profile by performing an eigendecomposition based on the raw measurement data set and selecting an eigenmode ascertained in the process as a reduced effect profile; and estimating the temporally varying scaling, caused by the temporal variation of the excitation signal, of the reduced effect profile in the variation profiles of the raw measurement data set.

4. The method of claim 3, wherein a corrected measurement data set is determined by mathematically removing known measurement influences caused by the measurement device from the variation profiles of the raw measurement data set.

5. The method of claim 4, wherein the eigendecomposition carried out on the basis of the raw measurement data set is performed on the corrected measurement data set.

6. The method of claim 4, wherein estimating the temporally varying scaling, caused by the temporal variation of the excitation signal, of the reduced effect profile in the variation profiles of the raw measurement data set comprises:

calculating profile excitation amplitudes of the reduced effect profile in a plurality of the variation profiles of the corrected measurement data set; and representing the calculated profile excitation amplitudes depending on the respective measurement times of the underlying variation profiles of the raw measurement data set as the temporally varying scaling.

7. The method of claim 3, comprising performing the eigendecomposition on the corrected measurement data set while determining the reduced effect profile.

8. The method of claim 1, wherein fitting the temporally varying scaling to determine the full effect profile comprises a respective fitting of the temporally varying scaling to the variation profiles of the raw measurement data set at a plurality of locations in the variation profiles of the raw measurement data set over the time course of the variation profiles to determine a respective excitation amplitude of the temporally varying scaling in the variation profiles for the respective location in the variation profiles, wherein a totality of the determined excitation amplitudes forms the full effect profile of the optical property.

9. The method of claim 1, further comprising, for a given variation profile, determining an effect amplitude of the variation profile by fitting the full effect profile to appropriate variation profiles of the raw measurement data set, wherein the calibration data comprise a correlation between the effect amplitudes and a temporally varying parameter of the excitation signal.

10. The method of claim 9, wherein the excitation signal is configured so that comparison measurements with a uniform excitation signal value are carried out at different times during the measurement of the variation profiles of the raw data set, and wherein a background noise is removed from the variation profiles using the comparison measurements before the fitting of the full effect profile to the appropriate variation profiles.

11. The method of claim 1, wherein the full effect profile is fitted using a profile model, which comprises a specified target profile and a specified sensitivity of a possible constructive error of the manipulable optical module and a parameter of an associated constructive error is ascertained by fitting.

12. The method of claim 1, wherein the temporally varying excitation signal is formed by superposing a basic signal with an alternating signal.

13. The method of claim 1, wherein the variation profile is a deformation profile of an optical surface of the optical module.

14. The method of claim 13, wherein the manipulation element comprises an actuator.

15. The method of claim 14, wherein the actuator is configured to change its extent parallel to the optical surface.

16. The method of claim 1, wherein the variation profile describes a variation in refractive index in an optically transmissive material.

17. A system configured to calibrate a manipulable optical module for a microlithographic projection exposure apparatus, the optical module comprising a manipulation element configured to set an at least one-dimensional local variation profile of an optical property of the optical module, the system comprising:

a signal transmitter configured to apply a temporally varying excitation signal to the manipulation element;

a measurement device configured to determine a raw measurement data set by measuring local variation profile a resulting at different times during the variation of the excitation signal; and an evaluation device configured to:

estimate a temporally varying scaling, caused by the temporal variation of the excitation signal, in the variation profiles of the raw measurement data set;

determine a full effect profile of the optical property by fitting the temporally varying scaling to the variation profiles of the raw measurement data set; and determine calibration data of the manipulable optical module on the basis of the full effect profile.

18. An apparatus, comprising:

a system according to claim 17, wherein the apparatus is a microlithographic projection exposure apparatus.

19. The apparatus of claim 18, further comprising:

an illumination system; and a projection lens, wherein the projection lens comprises the system.

20. The microlithographic projection exposure apparatus of claim 19, wherein the system further comprises an optical element.

\* \* \* \* \*